United States Patent [19]

Nishizawa et al.

[11] 4,416,952
[45] Nov. 22, 1983

[54] OXYNITRIDE FILM AND ITS MANUFACTURING METHOD

[75] Inventors: Jun-ichi Nishizawa; Ikuo Shiota, both of Sendai, Japan

[73] Assignee: Zaidan Hojin Handotai Kenkyu Shinkokai, Sendai, Japan

[21] Appl. No.: 351,618

[22] Filed: Feb. 24, 1982

Related U.S. Application Data

[60] Division of Ser. No. 215,442, Dec. 11, 1980, Pat. No. 4,331,737, which is a continuation of Ser. No. 23,766, Mar. 26, 1979, abandoned.

[30] Foreign Application Priority Data

Apr. 1, 1978 [JP] Japan ................................. 53-38580
Jul. 14, 1978 [JP] Japan ................................. 53-86573

[51] Int. Cl.³ .................... B32B 15/04; C01B 21/06
[52] U.S. Cl. .................................. 428/698; 148/33.3; 423/353; 423/392; 427/82; 427/88; 428/469; 428/697; 428/701; 428/702
[58] Field of Search ............... 428/698, 701, 702, 689, 428/411, 457, 697; 427/82, 88; 148/33.3; 423/353, 392

[56] References Cited

U.S. PATENT DOCUMENTS 4,018,631  4/1977  Hale .................................... 428/469
4,336,304  6/1982  Landingham et al. ......... 428/698 X
4,336,305  6/1982  Tanaka ............................ 428/698 X

OTHER PUBLICATIONS

D. M. Brown et al., J. Electrochem. Soc., vol. 115, 1968, p. 311.
T. L. Chu, J. Electrochem. Soc., vol. 118, 1971, p. 1200.

Primary Examiner—Thomas J. Herbert, Jr.
Attorney, Agent, or Firm—Cushman, Darby & Cushman

[57] ABSTRACT

The oxynitride film according to the present invention contains Ga and/or Al and has O/N ratio of at least 0.15. This film is obtained by relying on, for example, chemical vapor deposition technique. The O/N ratio in the film may be varied by, for example, varying the distance between the substrate and the substance-supply source, or by varying the proportion of an oxidizing gas contained in a carrier gas. This film is used either as a surface passivation film of III–V compound semiconductors such as GaAs, or as an insulating film for active surface portions of IG-FET, or as an optical anti-reflective film.

9 Claims, 16 Drawing Figures

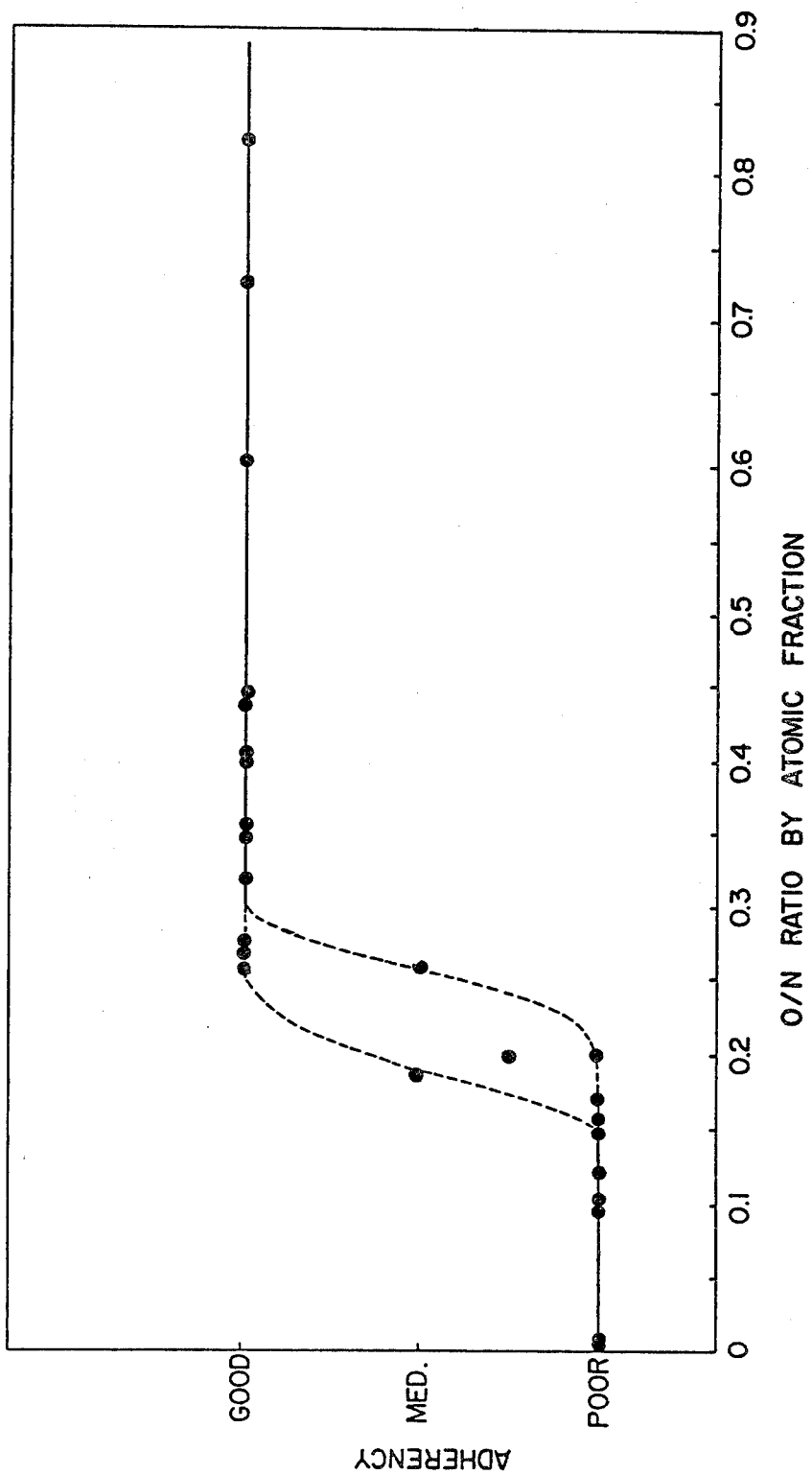

OXYNITRIDE FILM AND ITS MANUFACTURING METHOD

This is a division of application Ser. No. 215,442 filed Dec. 11, 1980, now Pat. 4,331,737, which in turn is a continuation of application Ser. No. 23,766, filed Mar. 26, 1979.

BACKGROUND OF THE INVENTION (a) Field of the invention:

The present invention concerns an oxynitride film containing gallium and/or aluminum, and its manufacturing method.

Such oxynitride film as stated above is very useful and effective for use not only as an optical but also an electrical material because it is possible to continuously vary the values of, for example, refractive index and dielectric constant of this film by varying the proportion between oxygen and nitrogen which are contained in the film to be formed. Furthermore, by depositing such oxynitride film on a semiconductor surface, it is possible to use it as a surface passivation film thereof also. here, the term "surface passivation film" means not only a surface-protection film in its narrow sense, but also a gate-insulating film of such articles as insulated-gate type field effect transistor, insulated-gate type static induction transistor, and insulated-gate type semiconductor integrated circuit using these transistors, and furthermore the film may serve as: a selective diffusion film employed in the planar semiconductor device manufacturing technique, a thin encapsulating film in post-ion-implantation annealing technique, a masking film employed in the selective growth technique, and a thin insulating film which is incorporated in those active portions of an active device and an insulating film for passive use other than the use mentioned above.

(b) Description of the prior art:

Description will hereunder be made firstly with respect to surface pasivation of III-V compound semiconductors. Known surface passivation methods for III-V compound semiconductors which are made typically of GaAs may be divided roughly into the following three types.

(1) A method of using, also for III-V semiconductors, such deposited films as $SiO_2$, $Si_3N_4$, $Al_2O_3$ and $P_2O_5$ which have been used as passivation films for the surfaces of silicon semiconductors. This known method, while having the drawback that the deposition temperature is relatively high, is being used quite frequently at present. Especially an $SiO_2$ film is widely used in technical fields excluding those semiconductor devices which are designed to use their surface portions just beneath the interface with the $SiO_2$ as an active region, for reasons such as easiness of formation of this film and also in view of the utilization of the accumulated knowledges concerning the method of producing planar type silicon semiconductor devices, and for like reaons, in spite of the important drawbacks that this $SiO_2$ film tends to take in Ga from the surface of a substrate made of GaAs or GaP and that thereby it will damage the stoichiometry of the surface of the substrate.

(2) A method of forming, on a substrate, a native oxide film corresponding to a thermal oxidation film of silicon, in place of the deposited film stated in (1) above. Among those techniquies belonging to the type categorized by this paragraph (2), the anodic oxidation method has the advantage that an insulating thin film can be formed at a markedly low temperature as compared with the deposition method and also with the thermal oxidation method, irrespective of the instances wherein a solution is used or a gas plasma is used. Conversely, however, this anodic oxidation method has the disadvantage that it is thermally unstable, and therefore, it has the drawback that the quality of the film will change substantially at a temperature below the temperature range adopted for thermal diffusion of impurities and post-ion-implantation annealing. Furthermore, the interface between an anodic oxide film and a substrate made of GaAs or GaP tends to contain a number of defects, so that when this film is utilized as an insulating film of IG-FET (Insulated-Gate Type FET), there still cannot be obtained as yet a large value of surface mobility comparable with that within the bulk, and thus at the current technical stage, it is not possible for the anodic oxide film to fully display those advantages and features on applying it to the surface of GaAs and GaP substrates which are represented by higher mobility as compared with a silicon substrate. In III-V semiconductors which, essentially, are binary compounds, a direct thermal oxidation of their surfaces has not yet produced any satisfactory results with respect to the quality of the film produced or to the state of interface. Such native oxide film has the further drawback that it is dissolved in acids such as HF, HCl, and $H_2SO_4$. Therefore, native oxide films inconveniently cannot be used in such manfacturing process as would comprise a number of steps.

(3) A method of performing chemical oxidation by the use of, for example, hot hydrogen peroxide solution. This method is entailed by limitation in the thickness of the oxide film which is formed, and accordingly the extent of application of this method is limited also.

As discussed above, these known surface passivation methods for III-V compound semiconductors invariably have both strong points and weak points.

SUMMARY OF THE INVENTION

It is, therefore, a primary object of the present invention to eliminate the drawbacks noted in conventional surface passivation methods, and to provide new passivation films which can be formed at a relatively low temperature and which has a low surface state density, and also to provide a method of manufacturing such new passivation films. More particularly, the present invention contemplates the provision of new passivation film which are expressed generally as gallium oxynitride ($GaO_xN_y$) films, aluminum oxynitride ($AlO_xN_y$) films, and mixtures thereof, i.e. gallium-aluminum oxynitride ($Ga_x,Al_y,O_xN_y$) films, to passivate the surfaces of Group III-V compound semiconductors.

BRIEF DESCRIPTION OF THE DRAWINGS

FIG. 2 is a diagrammatic illustration, showing the relationship between adherency and O/N ratio by atomic fraction in said $GaO_xN_y$ film shown in FIG. 1.

DETAILED DESCRIPTION OF THE PREFERRED EMBODIMENTS

Description will hereunder be made of the principles of the surface passivation method of the present invention, and also on some embodiments by referring to the accompanying drawings.

For the convenience of explanation, gallium arsenide (GaAs) will be taken up as an example of III-V compound semiconductors, since GaAs is most widely employed among III-V semiconductors. The passivation method based on the principles of the present invention can be also applied to multi-component compound semiconductors containing Ga and As such as $Ga_xAl_{1-x}As$, $GaAs_xP_{1-x}$ and $In_xGa_{1-x}As_yP_{1-y}$ and also to other III-V compound semiconductors. It should be understood here that the oxynitride films according to the present invention can be formed by thermal decomposition technique, or by ordinary chemical vapor deposition (CVD) technique conducted at normal pressure or at a low pressure, or by plasma CVD technique, or by reactive sputtering technique, or by using a method designed to vary O/N /ratio by separately controlling the respective arrival rates, onto the surface of a substrate, of a nitride and an oxide from their supply sources, or by a method of performing heat treatment in an ammonium gas containing an oxidizing gas, or by a method of performing heat treatment in a nitrogen gas containing a nitrogen oxide gas, or by methods equivalent to the above-mentioned various methods. However, as a concrete embodiment, description will hereunder be made, first of all, of a $GaO_xN_y$ film which is formed by thermal decomposition method. O/N ratio described above is based on atomic fraction throughout the description of the present invention.

Figure 1:
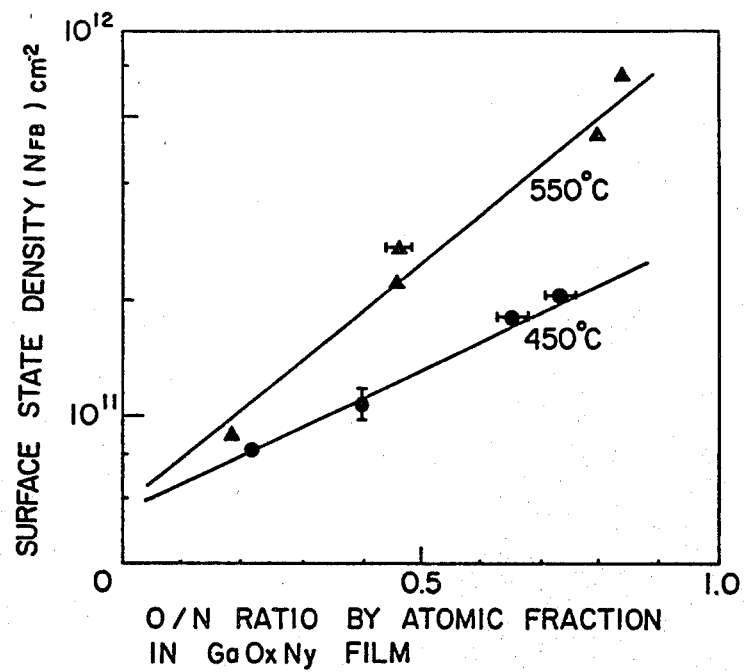
FIG. 1 is a diagrammatic illustration, showing ghe relationship between surface state density $N_{FB}$ and O/N ratio by atomic fraction of a $GaO_xN_y$ film of the present invention.

As the supply source of Ga and N, there is used a complex coupound of $GaBr_3$ and $NH_3$, which compound being prepared by treating gallium tribromide $GaBr_3$ in ammonia $NH_3$ gas. In order to control the composition ratio between O and N (O/N) in the film which is to be formed, $GaBr_3$ is subjected to absorbing a controlled amount of water or oxygen. Controlling of O/N ratio of the film to be formed may be carried out, in addition to the above-mentioned manner, by, for example, mixing nitrogen monoxide NO gas or oxygen $O_2$ gas in $NH_3$ as a carrier gas in which it is also possible to use the complex supply source of $GaBr_3$-$NH_3$ instead of the water-added one. The Ga, N and O-supply source thus prepared is subjected to heating at an appropriate temperature ranging between 250° C. and 350° C. to control the amount or rate of evaporation as required. Such supply source is transported onto a GaAs substrate by the aforesaid carrier gas of $NH_3$ at the rate of, typically, 2 liters/min. By thermal decomposition reaction, a $GaO_xN_y$ film is deposited on said GaAs substrate. The temperature of this GaAs substrate is set by means of a resistance-heating furance or by RF (radio frequency) heating means. In case a resistance-heating furnace is used, it is possible to finely control the O/N ratio in the $GaO_xN_y$ film which is to be formed, by varying the distance L between the supply source and the GaAs substrate. More particularly, in case this distance L is set at a small value, O/N ratio in the film will increase, whereas in case the distance L is set at a large value, O/N ratio in the film will decrease. According to this depositing method, substantial deposition takes place till the temperature goes down close to 400° C. However, at 400° C. the rate of deposition becomes considerably small, being typically about 5 Å/min., and thus such deposition is far from being practical. On the other hand, at a high temperature of 600° C. or higher, the surface of the GaAs substrate becomes degraded, and furthermore the quality of the $GaO_xN_y$ film which is produced will tend to contain an excess amount of Ga. Therefore, the range of temperatures which does not bring about rejectable deterioration of the surface condition of the substrate during deposition, and which allows the quality of the $GaO_xN_y$ film to be kept reasonably satisfactory, and also which is practical, is 450–550° C. As an example, the result of a couple of experiments is mentioned below. By setting the temperature of the substrate at 450° C. and 500° C., the temperature of the supply source at 280° C., and the flow rate of carrier $NH_3$ gas at 2 liters/min., the deposition rates in these two instances are: 20–30 Å/min. and about 50 Å/min., respectively. O/N ratio can be varied according to the above-mentioned manner, and the range from zero (in case of pure GaN) up to the maximum of about 1.5 can be easily obtained. The surface state density $N_{FB}$ of the $GaO_xN_y$—GaAs system thus produced depends on O/N ratio, i.e. the smaller the O/N ratio is, the smaller the surface state density $N_{FB}$ becomes, as shown in FIG. 1. It will be understood also that, for any certain O/N ratio, a smaller value of $N_{FB}$ is obtained from the $GaO_xN_y$—GaAs system in which the deposition of the $GaO_xN_y$ film is made at a lower temperature. It should be understood, however, that the specific resistance of the $GaO_xN_y$ film will gradually become smaller with a lower O/N ratio, O/N≈0.2 serving as the boundary. As such, in case it is intended to form a $GaO_xN_y$ film having a smaller O/N ratio, there appears a limit thereto from the aspect of electrical breakdown voltage. This may be attributable to the fact that, in case O/N ratio is less than about 0.2, there arises a deterioration of adherency between the $GaO_xN_y$ film and the GaAs substrate, and that, accordingly, the quality of the film becomes poor, as shown in FIG. 2. However, in the range of O/N ratio from nearly 0.2 to 0.3, it is possible to easily obtain a $GaO_xN_y$ film having a resistivity which is high enough from practical viewpoint and to obtain those systems having a surface state density of $1 \times 10^{11}$ cm$^{-2}$ or lower. Accordingly, in case the substrate is GaAs, it is desirable to set O/N ratio at a value of at least 0.15, and more desirably at least 0.2. The higher the O/N ratio is increased, the higher will raise the specific resistance of the $GaO_xN_y$ film, and in accordance therewith the surface state density $N_{FB}$ also will increase. At the deposition temperature of 550° C. and when the O/N ratio is in the vicinity of 0.8, the surface state density $N_{FB}$ will take a value $0.8-1 \times 10^{12}$ cm$^{-2}$ which is substantially equal to the $N_{FB}$ value of conventional $Ga_2O_3$—GaAs systems. It should be noted here that the composition of $GaO_xN_y$ film at O/N ratio of 0.8 is about: $Ga \approx 46$ atomic %, $O \approx 24$ atomic % and $N \approx 30$ atomic %, and the composition at O/N ratio of 0.2 is about: $Ga \approx 48.5$ atomic %, $O \approx 8.5$ atomic % and $N \approx 43$ atomic %. As such, from the aspect of only surface state density, the present invention is able to freely encompass the range from pure GaN up to $Ga_2O_3$, although pure GaN and $Ga_2O_3$ are outside the range of application of the present invention.

Figure 3:
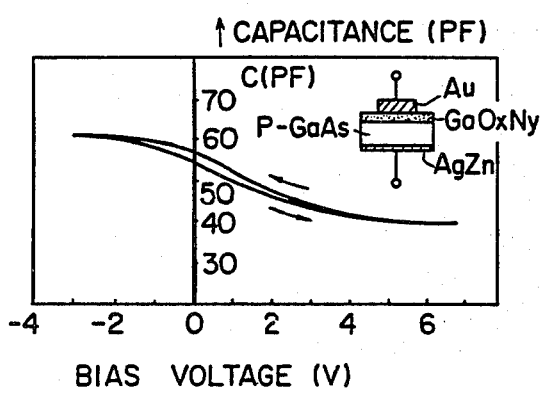
FIG. 3 is a diagrammatic illustration showing the capacitance-voltage characteristic of MIS structure using a $GaO_xN_y$ film of the present invention as an insulator.

FIG. 3 shows an example of capacitance-voltage characteristic of an Au-$GaO_xN_y$—GaAs (p type) structure in case O/N ratio is 0.4 and the $GaO_xN_y$ film thickness is 2500 Å. It should be understood that, on top of one surface of a p type GaAs substrate, a $GaO_xN_y$ film of the present invention is formed. An electrode made of Au is provided on this film. An ohmic contact made of an AgZn alloy (90:10 by weight) is provided on the other surface of this p type GaAs substrate. The frequency employed in the above-said capacitance-voltage characteristic test is 1 MHz. There is noted some hysteresis of the carrier injection type, but this is negligibly small.

Figure 4:
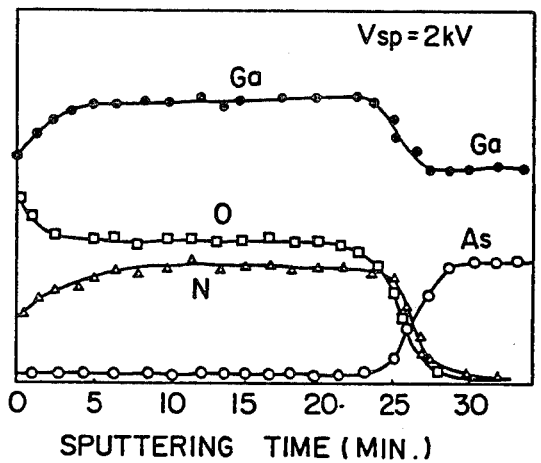
FIG. 4 is a diagrammtic illustration, showing the composition distribution of the $GaO_xN_y$ film in the direction of the depth of this film employed in FIG. 3, measured by using Auger electron spectroscopy technique combined with Argon ion-sputtering technique.

FIG. 4 shows the corresponding in-depth-composition distribution of the $GaO_xN_y$ film-substrate structure which is used to measure the C-V curve as shown in FIG. 3, and this is a result obtained from the Sputter-Auger method. In FIG. 4, the sputtering time (shown by horizontal axis) corresponds to the depth or distance measured from the exposed surface of the film carried on the substrate. It will be easily inferred from FIG. 4 that, in the vicinity of the interface between the film and the substrate, there is present only negligibly little transition region of abnormal composition which is observed in known thermal oxidation method or anodic oxidation method, and that this interface has little defects. From this Figure, it is clearly noted, therefore, that in the case of a $GaO_xN_y$ film of the present invention, there can be materialized a satisfactory interface having a low surface state density.

Figure 5:
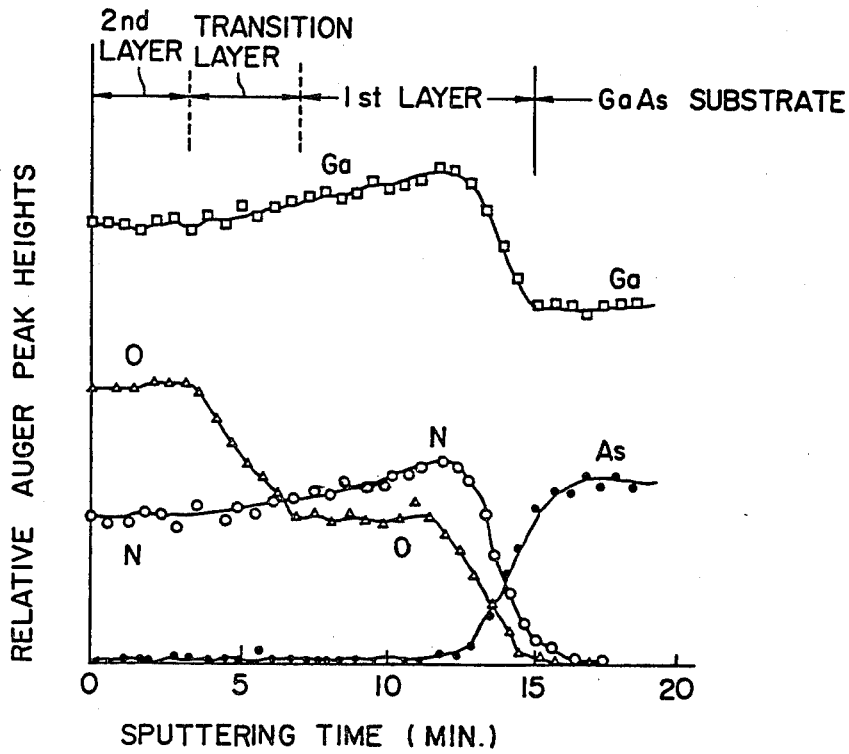
FIG. 5 is a diagrammatic illustration of the composition distribution of an example of film according to the present invention.

Furthermore, from those results stated above, it is possible to obtain a passivation film having a small surface state density and exhibiting a good insulating ability, by establishing a relatively small O/N ratio of a first $GaO_xN_y$ film contacting the GaAs substrate to minimize the surface state density of this film-substrate structure, and also by forming, on top of this film, a second $GaO_xN_y$ film having a large O/N ratio. The composition distribution of this structure is shown in FIG. 5, which is taken by using Auger electron spectroscopic analysis combined with argon sputtering. The deposition temperature employed is 450° C., and the supply source temperature is 320° C. The growth of the first layer which contacts the GaAs substrate is arranged so that the O/N ratio thereof is determined by the oxygen amount contained in the supply source. At the time of growth of the second $GaO_xN_y$ layer, the atmosphere gas is arranged to further contain nitrogen monoxide (NO) to thereby increase the amount of oxygen which is taken into the second film. In this instance, the flow rate of the NO gas is 0.9 liter/min. for the rate of 2.5 liters/min. of $NH_3$ gas. In the case of FIG. 5, the O/N ratio of the first layer is about 0.3, and that of the second layer is about 0.77. It is preferable that the O/N ratio of the first layer is at least 0.15 and that the O/N ratio of the second layer is at least 0.3. The surface state density resulting from this double layer $GaO_{x2}N_{y2}$—$GaO_{x1}N_{y1}$ (wherein: $x_2/y_2 > x_1/y_1$) which is formed continuously is a very small value, being for example $8 \times 10^{10}$ cm$^{-2}$, and besides the insulating ability of this film is good. It should be understood here in FIG. 5 that the relatively gentle variation noted in the composition located in the interface region between the first $GaO_xN_y$ layer and the substrate GaAs is attributable partially to the artifact arising from the sputtering event, and thus in reality the thickness of such composition-varying region may be smaller than the width of the transition layer located between the first layer and the second layer.

Figure 6:
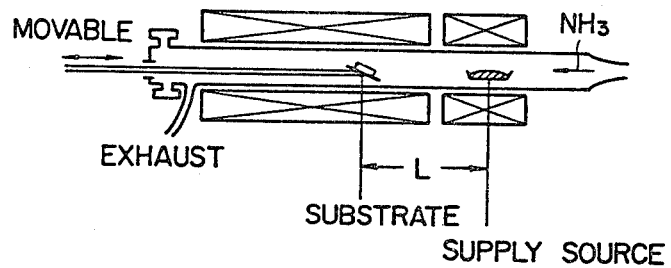
FIG. 6 is a schematic illustration, showing the positional relationship between the substrate and the substance-supply source placed in a reaction tube for the depostion of a $GaO_xN_y$ film on the substrate.

Another method of forming a multi-layered film like the one stated above according to the present invention is based on the utilization of the fact that the O/N ratio in the $GaO_xN_y$ film varies with the distance L between the substrate and the supply source shown in FIG. 6. More particularly, this method utilizes the fact that the O/N ratio is great when this distance L is small, and that, conversely, the O/N ratio will become small when the distance L is great, and thus a multilayered film having a composition distribution similar to that shown in FIG. 5 can be formed. As an example, in case the substrate temperature is 500° C. and the supply source temperature is 280° C., and in case L=14 cm, the value of the O/N ratio obtained is 0.6 -0.8, and in case L=22 cm, the O/N ratio obtained is 0.4–0.5. In this case, for the deposition of the first film the distance L is set large, and for that of the second film the distance L is set small. The reason for the variation in oxygen content in association with the distance L is considered to be explained as follows. The sub-oxide of gallium, such as $Ga_2O$, which has a high equilibrium vapor pressure and which is contained in the source material may be deposited in greater amount onto the wall of the reaction tube in case the distance L is greater, and accordingly the amount of Ga and the amount of oxygen O which deposit on the surface of the substrate will decrease.

According to this method described above, it is only necessary to vary the position of the substrate relative to the source, while keeping such parameters as ambient gases and the source constant. Thus, this method is very efficient to control the O/N ratio in the film. Furthermore, by combining the above-state method with those designed to vary the flow of the carrier gas and to vary the source temperature, the O/N ratio in the $GaO_xN_y$ film can be varied more efficiently. It should be understood that in case the flow rate of the carrier gas is decreased, the proportion of deposition of the gallium sub-oxide onto the wall of the reaction tube increases, so that the O/N ratio will decrease. Conversely, in case the supply source temperature is elevated, the supply rate of this source onto the substrate will relatively increase, so that O/N ratio will increase. It is needless to say that the number of the $GaO_xN_y$ layers having different O/N ratios is not limited to two layers mentioned above, and that a greater number of layers may be provided.

Figure 7:
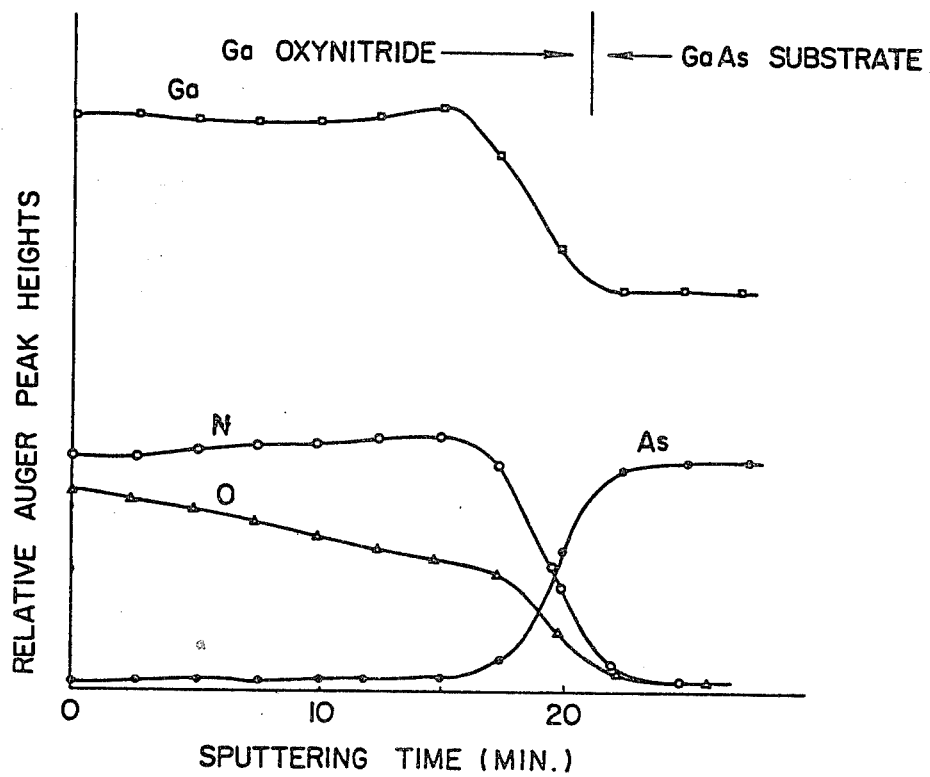
FIG. 7 is a diagrammtic illustration, showing the composition distribution of another example of the film according to the present invention.

Description has been made to those embodiments wherein the O/N ratio of the $GaO_xN_y$ film is varied substantailly stepwise in the direction of its thickness. However, the structure of the film may be of the type that the O/N ratio of the $GaO_xN_y$ film continuously increases as the location goes closer toward the exposed surface thereof, as shown in FIG. 7. In this embodiment, $O/N \approx 0.2$ in the vicinity of the interface, and it is about 0.36 at the uppermost surface of the film.

Figure 8:
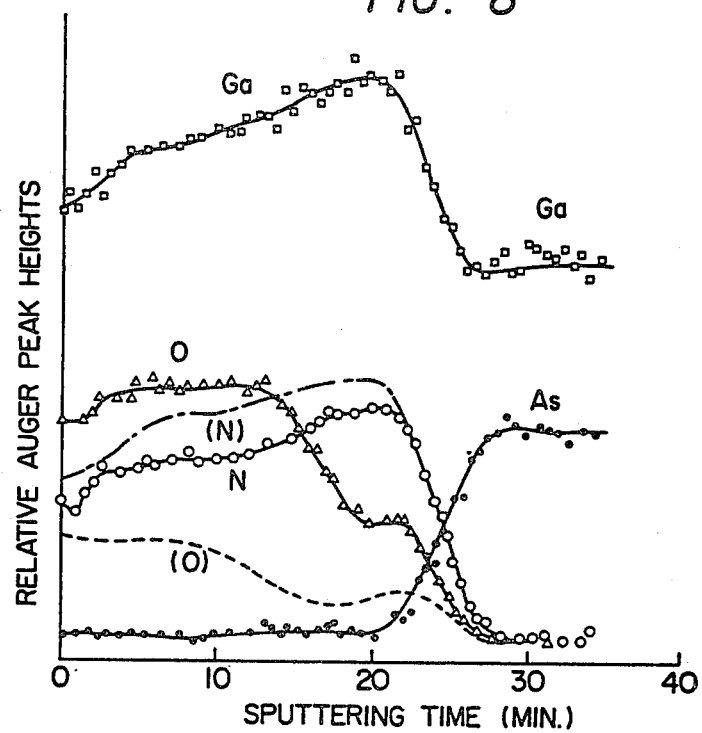
FIG. 8 is a diagrammatic illustration showing the composition distribution prior to and after a heat treatment of a $GaO_xN_y$ film of the present invention in an $NH_3$ gas containing an oxidizing gas.

Still another method of varying the O/N ratio in the film according to the present invention is to subject the $GaO_xN_y$ film prepared in advance to heat treatment either in an ammonium gas atmosphere containing an oxidizing gas or in a nitrogen gas atmosphere containing a nitrogen oxide such as NO or $NO_2$. By conducting this heat treatment in an atmosphere containing nitrogen, it is possible to control the vapor pressure of nitrogen evaporating from the $GaO_xN_y$ film, and no such abnormal oxide layer is produced at the interface as that noted in the instance wherein oxidation is carried out in an atmosphere containing only $O_2$ gas, and thus it is possible to uniformly oxidize all the portions within the film. As an example, description will be made hereunder with respect to the instance wherein an $NH_3$ atmosphere is employed. The composition distribution in the instance wherein heat treatment is conducted for 30 minutes at 550° C. by adding $O_2$ at the rate of 100 cc/min. to the $NH_3$ of a flow rate of 1 liter/min. is shown in FIG. 8. The dotted line and the one-dot chain line indicate the composition distributions of oxygen and nitrogen, respectively, prior to heat treatment. It will be noted that only the $GaO_xN_y$ film is oxidized, and that oxidation of that portion of the surface of the GaAs substrate located at the interface has not taken place. Similar phenomena are noted also in the instance wherein a nitrogen oxide such as NO or $NO_2$ is mixed in the $N_2$ atmosphere. It will be understood that such methods are very effective as a means for controlling the O/N ratio in the $GaO_xN_y$ film without sacrificing those interface characteristics stated above.

Figure 9:
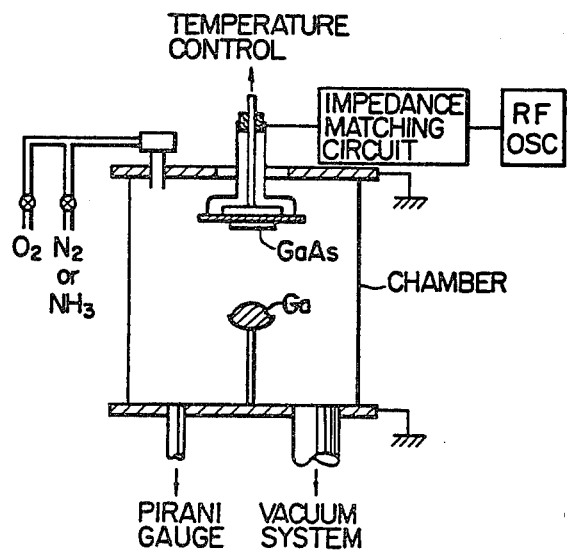
FIGS. 9 and 10 are diagrammatic illustrations for explaining another example of formation of a $GaO_xN_y$ films of the present invention.

Description will hereunder be made with respect to another medthod of forming $GaO_xN_y$ films. An example of such method using the RF-reactive sputtering technique is shown in FIG. 9. From an RF (radio-frequency) oscillator of, for instance, 13.56 MHz via an impedance-matching circuit, an electric power of the order of 200W is supplied across the opposing two electrodes. Either $N_2$ gas or $NH_3$ gas, which in some cases is diluted by inactive gases such as Ar and He, is introduced into a vacuum chamber until the pressure of this gas reaches $10^{-4}-10^{-2}$ Torr to thereby produce plasma therein. At the same time therewith, in order to control O/N ratio, $O_2$ gas or other oxidizing gas such as NO and $NO_2$ is introduced also at an arbitrary rate. One of the two electrodes is made of a Ga metal which serves as Ga source and GaAs which will serve as a substrate is mounted on the other one of the electrodes. Those sputtered Ga atoms easily react with the nitrogen and oxygen which are being energized in the plasma, and the resulting molecules deposit as a $GaO_xN_y$ layer on the GaAs substrate. The reaction between Ga, N and O takes place also when gallium atoms contact the exposed surface of the GaAs substrate. In this way, it is possible to form a $GaO_xN_y$ film having an arbitrary O/N value. In case of formation of an $AlO_xN_y$ film, such film may be formed in a manner similar to that stated above, by the use of aluminum source.

Figure 10:
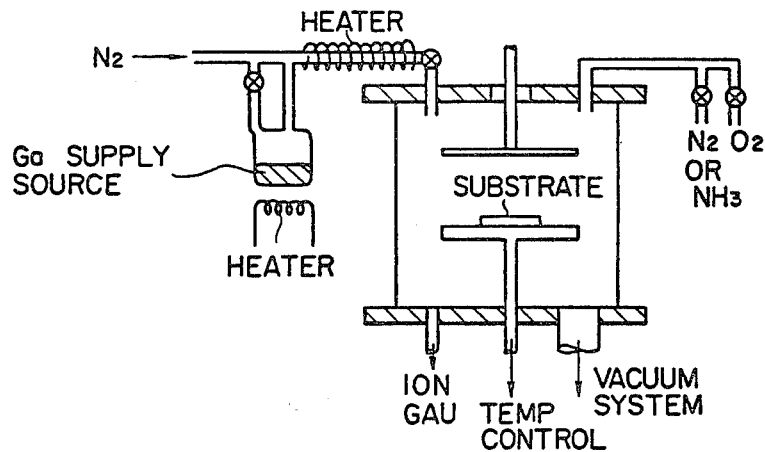

FIG. 10 diagrammatically shows a method of forming a $GaO_xN_y$ film by relying on the low-pressure plasma reaction technique utilizing plasma discharge by parallel flat plate electrodes. As the Ga-supply source, a Ga halide such as $GaBr_3$ is employed. The rate of evaporation of $GaBr_3$ from this Ga-supply source is controlled by controlling the temperature of this supply source at a value between 120° C. and 200° C. The evaporated Ga from the supply source is transported into a vacuum chamber, and this vapor is mixed with an oxidizing gas which, typically, is $O_2$ gas which is introduced therein through another gas inlet and also mixed with $N_2$ or $NH_3$ gas, while maintaining the overall pressure at a value between $10^{-1}$ and 100 Torr to render them to plasma state, and thus a $GaO_xN_y$ is deposited onto the substrate. During the formation of this film, it is possible to obtain a $GaO_xN_y$ of high quality by elevating the temperature of the substrate up to about 300° C. Same procedure applies to the formation of $AlO_xN_y$ films.

In FIG. 10, mention has been made of parallel flat plate electrodes as plasma-generation electrodes, for the convenience of explanation. It is needless to say that the electrodes may be of the coil type or cylindrical type, and that accordingly the reaction chamber will ftake the configuration such as horizontal type shown in FIG. 6. It should be understood also that, instead of energizing the reaction gases into plasma state, they may be used also as the ground state at a low pressure to obtain an oxynitride film having a uniform quality throughout the film.

Also, by causing evaporation of a pure nitride and a pure oxide by electron bombardment in a vacuum of $10^{-6}$ or lower, and by thus causing deposition of those substances onto a same surface of a substrate, it is possible to form an oxynitride. In such instance, it is possible to vary the O/N ratio of the film by controlling the arrival rate of each substance either by independently controlling the current of electron beam bombarding these substances, respectively, or by independently controlling the respective flow rates of the substances through chopper means.

It will be clear that, in case other insulating material such as $SiO_2$, $Si_3N_4$, $Al_2O_3$, $P_2O_5$, $B_2O_3$, $Ga_2O_3$, BN, or Aln is deposited onto those $GaO_xN_y$ films stated above, the effect and advantages of the present invention are not sacrificed at all.

Another feature of the present invention is found in that the films obtained according to the present invention are superior to known anodic oxide films and like known films in the ability to resist against the attack of chemical reagents. Anodic oxide films are easily dissolved in such well-known acid solutions as HF, HCl and $H_2SO_4$. However, the $GaO_xN_y$ films obtained according to the present invention exhibit strong resistivity to these acids, excepting that these films are affected by HCl of 50° C. or higher. Also, these films of the present invention are resistive, at 50° C., to the well-known chemical etching solution of GaAs, i.e. $H_2SO_4$:$H_2O_2$:$H_2O$=4:1:1 (by volume). Accordingly, these films can be used as a masking material for selective etching of GaAs semiconductors. Furthermore, the structure of these films is stable against heat treatment when they are subjected to those high temperatures employed in the manufacturing processes of GaAs devices.

Figure 11A:
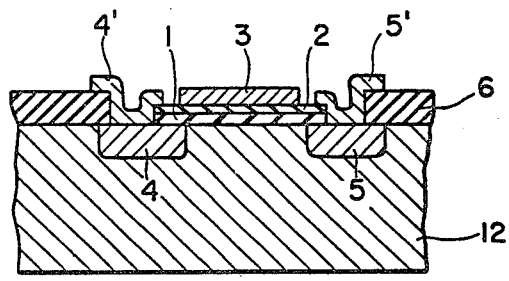
FIGS. 11A to 11C are schematic sectional views, showing the instances wherein the $GaO_xN_y$ film of the present invention is applied to an insulating film of insulated-gate type field effect transistors.
Figure 11B:
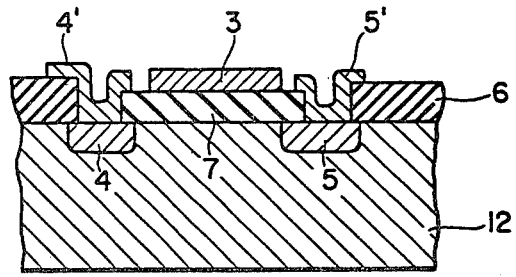
Figure 11C:
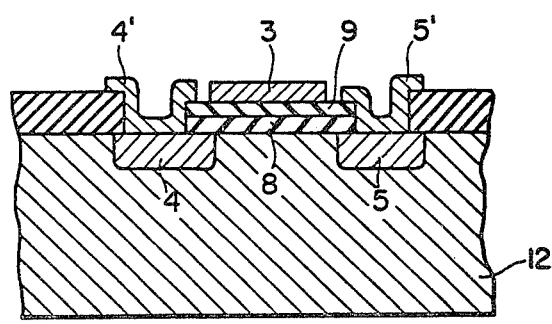

The $GaO_xN_y$ films having controlled O/N ratios which are obtained according to the present invention are effective in case such film is used, for example, as a gate-insulating film for active portions of an insulated-gate type field effect transistor (IG-FET) shown in section in FIGS. 11A–11C. It is possible to set the threshold voltage $V_{th}$ of the IG-FET at an arbitrary value by controlling O/N ratio, and thus it is possible to substantially enlarge the freedom of designing.

FIG. 11 A shows an embodiment wherein the $GaO_xN_y$ films 1 and 2 having such different O/N ratios as having a smaller value in the film 1 than that in the film 2 are superposed one upon another. Also, as in the case of FIG. 11B, it is also possible to freely control the surface potential of the transistor without deteriorating the interface characteristic by continuously increasing the O/N ratio toward the interface with gate electrode 3 in the $GaO_xN_y$ film 7. Furthermore, as shown in FIG. 11C, even in case the first-formed $GaO_xN_y$ film 8 is used in combination with another insulating film 9 made of, for example, $Si_3N_4$, $Al_2O_3$, $Ga_2O_3$ or $SiO_2$, the interface characteristic between this $GaO_xN_y$ film 8 and the semiconductor substrate 12 is not spoiled. Herein, reference numeral 3 represents a gate electrode. 4 and 5 represent a source region and a drain region, respectively. 4' and 5' represent a source electrode and a drain electrode, respectively. 6 represents a field insulating film made of, for example, $SiO_2$. 12 represents said semiconductor substrate. The source region 4 and the drain region 5 have a conductivity type opposite to that of the semiconductor substrate 12.

Figure 12A:
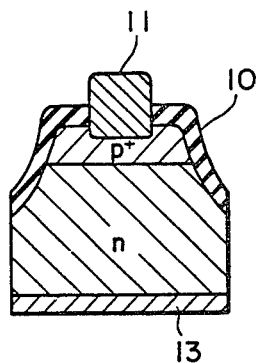
FIGS. 12A and 12B are schematic sectional views, showing the instances wherein a $GaO_xN_y$ film of the present invention is employed as a surface protection film of pn junction, respectively.
Figure 12B:
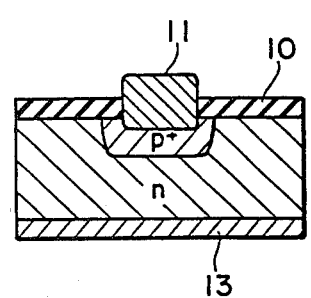

Apart from the application of the present invention to IG-FET which has been described above, an example wherein the present invention is applied as a passivation film of pn junction is shown in FIGS. 12A and 12B. Formation of a contact window through the $GaO_xN_y$ film is performed by relying on the ordinary photo-etching technique. As one such example, a photo-resist which is resistant to heat and acid, for example, AZ 1350J (name of a product of Shipley Company of U.S.A.), is applied onto the $GaO_xN_y$ film 10 as a first step, followed by exposure to light and by development. Thereafter, the photo-resist locating at such sites intended for electrodes is removed to expose the $GaO_xN_y$ film thereat. Etching of the $GaO_xN_y$ film is carried out by the use of a hot phosphoric acid ($H_3PO_4$) solution held at 70° C. The etching rate is substantially 100 Å/min.. In order to improve the adherency between an ohmic contact metal and the substrate after the $GaO_xN_y$ film has been locally removed, the surface of the substrate is subjected to slight etching by the use of an etchant solution of, for example, $H_2SO_4$:$H_2O_2$:$H_2O$ = 10:1:1 (by volume), to thereby expose a fresh surface of the substrate. On top of this portion of surface, there is placed an electrodeforming metal 11 by relying on, for example, evaporation technique and then subjected to sintering at an appropriate temperature and for an appropriate length of time. In FIGS. 12A and 12B, reference numeral 13 represents an ohmic electrode for another region. According to this method stated above, there can be obtained a pn junction having little leakage current and having a sharp breakdown characteristic. It is needless to say that his surface passivation method can be applicable to all kinds of pn junctions and to Schottky junctions which are constructed by III-V compound semiconductors in such devices as laser diode, light-emitting diode, field effect transistor, static induction transistor and solar cell.

As stated concretely above, the $GaO_xN_y$ films according to the present invention can be applied not only to all those technical fields in the manufacture of planar devices which have been fulfilled by $SiO_2$ film (provided that, with respect to selective oxidation, the application thereto of the film of the present invention is difficult from the viewpoint of special nature of the thermal oxidation of the $GaO_xN_y$—III—V compound semiconductor systems), but also can be appropriately applied to particular fields of fabrication processes of III—V compound semiconductor devices such as encapsulating films for post-ion implantation annealing.

Figure 13:
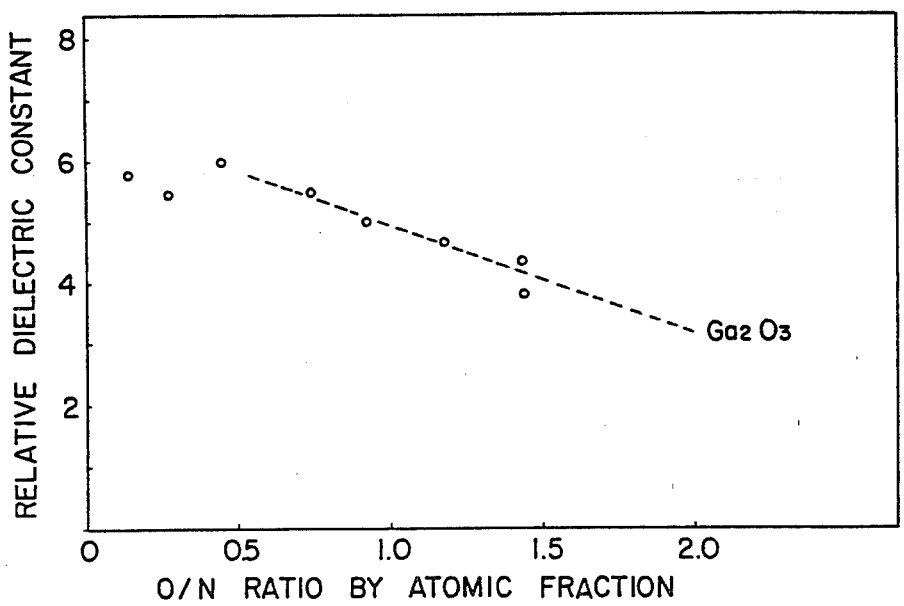
FIG. 13 is a diagrammatic illustration, showing the variation of relative dielectric constant exhibited by a $GaO_xN_y$ film of the present invention, depending on the changes in its O/N ratio by atomic fraction.

Description has been made above with respect to embodiments wherein the oxynitride films are applied as passivation films of the surfaces of semiconductors. It should be understood that the oxynitride films according to the present invention are such that, by altering the O/N ratios thereof, the dielectric constant and the refractive index of the films can be altered also. As one such example, variation of the relative dielectric constant due to changes in the O/N ratio of the $GaO_xN_y$ film is shown in FIG. 13. Within the range of O/N ratio of about 0.5 or higher, the value of relative dielectric constant will decrease continuously with an increase in the O/N ratio, and will gradually approach the value of about 3.1 of $Ga_2O_3$. Such nature of the film is very useful as an optical material in, for example, antireflection coating.

As explained above, the object of the present invention lies in the provision of gallium oxynitride films, aluminum oxynitride films and mixture films of these two substances, and also in the provision of a method of making these films. By utilizing the fact that the optical constant of such film as mentioned above can vary by varying the ratio between oxygen and nitrogen to be contained in the film, the film may be used also as a reflection-proof film, this implying the effectiveness of the oxynitride film in its application to an optical material. Similarly, the film may be utilized as a dielectric material, and furthermore, as a surface passivation film for III—V compound semiconductors. It should be understood that, in case of $GaO_xN_y$ film, the surface state density can be made low, and along therewith the insulating ability of the film can be enhanced either by uniformalizing the composition distribution of the film or by making small the O/N ratio of the first $GaO_{x1}N_{y1}$ film (layer) which contacts a III—V compound semiconductor substrate, and by arranging so as to stepwisely or continuously increase the O/N ratio of the adjacently disposed second $GaO_{x2}N_{y2}$ film (layer). Thus, the film is most suitable for surface passivation of insulated-gate type field effect transistor and static induction transistor, laser diode, light-emitting diode, solar cell and various other electronic devices, and therefore, the industrial value of these films of the present invention is very great.

What is claimed is:

1. An oxynitride film formed of an oxynitride of one substance selected from the group consisting of gallium, aluminum and their mixture, said oxynitride having a finite and non-zero molar ratio of oxygen to nitrogen.

2. An oxynitride film according to claim 1, in which said oxygen-to-nitrogen molar ratio is at least 0.15.

3. An oxynitride film according to claim 1 having the formula $GaO_xN_y$, $AlO_xN_y$, or $Ga_xAl_yO_xN_y$ where x is the atomic fraction of oxygen and y is the atomic fraction of nitrogen based on the total atoms of oxygen and nitrogen.

4. An oxynitride film according to claim 1, in which said film is formed on an underlying substrate.

5. An oxynitride film according to claim 4, in which said film serves as an underlying material for of another film.

6. An oxynitride film according to claim 4, in which said oxygen-to-nitrogen ratio varies in the direction of thickness of said film.

7. An oxynitride film according to claim 4 wherein the underlying substrate is formed of at least one substance selected from the group consisting of gallium and aluminum.

8. An oxynitride film according to claim 4 in which said underlying substrate is formed of at least one substance selected from the group consisting of gallium, aluminum and indium.

9. An oxynitride film according to claim 8, in which said one substance is gallium and said oxygen-to-nitrogen molar ratio is at least 0.15.

* * * * *